US009685151B2

(12) United States Patent
Torres

(10) Patent No.: US 9,685,151 B2
(45) **Date of Patent: *Jun. 20, 2017**

(54) TRANSITIONING BETWEEN ARRAYED AND IN-PHASE SPEAKER CONFIGURATIONS FOR ACTIVE NOISE REDUCTION

(71) Applicant: Bose Corporation, Framingham, MA (US)

(72) Inventor: Wade P. Torres, Attleboro, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/297,229

(22) Filed: Oct. 19, 2016

(65) Prior Publication Data

US 2017/0040015 A1 Feb. 9, 2017

Related U.S. Application Data

(63) Continuation of application No. 14/749,823, filed on Jun. 25, 2015, now Pat. No. 9,508,336.

(51) Int. Cl.
*H03B 29/00* (2006.01)
*G10K 11/178* (2006.01)

(52) U.S. Cl.
CPC .... *G10K 11/178* (2013.01); *G10K 2210/1282* (2013.01); *G10K 2210/3215* (2013.01); *G10K 2210/3229* (2013.01)

(58) Field of Classification Search
CPC .......... H04R 27/00; H04R 5/04; H04R 1/406; H04R 2217/03; H04R 2430/23; H04R 3/005; H04R 3/12

(Continued)

(56) References Cited

U.S. PATENT DOCUMENTS 4,503,553 A * 3/1985 Davis .................... H04R 1/227 181/144
5,133,017 A 7/1992 Cain et al.

(Continued)

OTHER PUBLICATIONS

International Search Report and Written Opinion dated Sep. 21, 2016 for PCT/US2016/038893.

(Continued)

*Primary Examiner* — Akelaw Teshale
(74) *Attorney, Agent, or Firm* — Bose Corporation

(57) ABSTRACT

A noise cancellation method and system comprises a system controller that produces a command signal in response to a signal from at least one microphone detecting sound in an area. The system controller includes an arrayed speaker controller for producing a driver signal for each speaker in response to the command signal such that combined sound emitted by the speakers in response to the driver signals produces a substantially uniform sound pressure field adapted to attenuate a noise field corresponding to the sound detected by the at least one microphone. The system controller includes an in-phase speaker controller for producing a common in-phase driver signal for all speakers in response to the command signal and a signal director module for proportioning the command signal between the arrayed and in-phase speaker controllers in response to a magnitude of voltage associated with driving the speakers in accordance with the command signal.

21 Claims, 9 Drawing Sheets

(58) Field of Classification Search
USPC .... 381/28, 92, 118, 71.4, 71.5, 71.7, 82, 86, 381/94.3, 94.7
See application file for complete search history.

(56) References Cited

U.S. PATENT DOCUMENTS

| | | | | |
|---|---|---|---|---|
| 8,340,312 | B2 | 12/2012 | Johnson et al. | |
| 9,508,336 | B1 * | 11/2016 | Torres | G10K 11/178 |
| 2003/0112980 | A1 | 6/2003 | Vaishya | |
| 2004/0208333 | A1 * | 10/2004 | Cheung | H04S 1/00 381/333 |
| 2006/0188107 | A1 | 8/2006 | Inoue et al. | |
| 2007/0086603 | A1 * | 4/2007 | Lyon | H04R 3/005 381/96 |
| 2007/0160240 | A1 | 7/2007 | Ito et al. | |
| 2007/0230284 | A1 * | 10/2007 | Singhi | G04C 11/04 368/46 |
| 2008/0304677 | A1 | 12/2008 | Abolfathi et al. | |
| 2009/0041258 | A1 * | 2/2009 | Nakajima | G10K 11/1788 381/71.2 |
| 2010/0098263 | A1 | 4/2010 | Pan et al. | |
| 2010/0266135 | A1 | 10/2010 | Theobald et al. | |
| 2010/0290635 | A1 | 11/2010 | Shridhar et al. | |
| 2011/0142248 | A1 | 6/2011 | Sakamoto et al. | |
| 2012/0155651 | A1 | 6/2012 | Obata et al. | |
| 2012/0288110 | A1 | 11/2012 | Cherkassky et al. | |
| 2013/0243225 | A1 | 9/2013 | Yokota | |
| 2013/0259250 | A1 | 10/2013 | Nicholson et al. | |
| 2013/0311040 | A1 | 11/2013 | Hasegawa et al. | |
| 2014/0233748 | A1 * | 8/2014 | Klug | G10K 11/178 381/71.4 |
| 2015/0003626 | A1 | 1/2015 | Trammell | |
| 2015/0163583 | A1 | 6/2015 | Howes et al. | |
| 2016/0100250 | A1 | 4/2016 | Baskin et al. | |

OTHER PUBLICATIONS

International Search Report and Written Opinion dated Sep. 13, 2016 for PCT/US2016/038894.

* cited by examiner

TRANSITIONING BETWEEN ARRAYED AND IN-PHASE SPEAKER CONFIGURATIONS FOR ACTIVE NOISE REDUCTION

CROSS-REFERENCE TO RELATED APPLICATIONS

This application is a continuation of U.S. application Ser. No. 14/749,823, filed Jun. 25, 2015, which is incorporated herein by reference in its entirety.

BACKGROUND

This specification relates generally to noise cancellation systems, and, more specifically, to noise attenuation or cancellation (referred to generally as noise cancellation) within a specific environment, such as a passenger compartment of a vehicle.

SUMMARY

All examples and features mentioned below can be combined in any technically possible way.

In one aspect, a noise-cancellation system comprises a plurality of speakers disposed within an area, an amplifier in communication with the speakers, and a system controller, in communication with the amplifier, producing a command signal in response to a signal from at least one microphone detecting sound in the area. The system controller includes an arrayed speaker controller configured to produce a driver signal for each speaker in response to the command signal such that combined sound emitted by the speakers in response to the driver signals produces a substantially uniform sound pressure field having a magnitude and phase adapted to attenuate a noise field corresponding to the sound detected by the at least one microphone. The system controller further includes an in-phase speaker controller configured to produce a common in-phase driver signal for all of the speakers in response to the command signal, and a signal director module configured to proportion the command signal between the arrayed speaker controller and the in-phase speaker controller in response to a magnitude of voltage associated with driving, by the amplifier, the speakers in accordance with the command signal.

Embodiments of the system may include one of the following features, or any combination thereof.

The noise cancellation system may further comprise a signal magnitude monitor measuring magnitude of voltage associated with the amplifier driving the speakers in accordance with the command signal. The signal director module may change the proportioning of the command signal between the arrayed speaker controller and the in-phase speaker controller in real time response to the magnitude measured by the signal magnitude monitor. The signal director module may transition to proportioning all of the command signal to the in-phase speaker controller, with none of the command signal being proportioned to the arrayed speaker controller, in real time response to the measured magnitude exceeding a threshold. The signal director module may transition to proportioning all of the command signal to the arrayed speaker controller, with none of the command signal being proportioned to the in-phase speaker controller, in real time response to the measured magnitude dropping below a threshold.

The noise cancellation system may further comprise a signal divider for dividing the command signal in accordance with the proportioning determined by the signal director module. The signal director module may direct the signal divider to increase a proportion of the command signal passing to the in-phase speaker controller, while decreasing a proportion of the command signal passing to the arrayed speaker controller, in real time response to an increase in the magnitude measured by the signal magnitude monitor.

The noise cancellation system may further comprise a signal divider for dividing the command signal in accordance with the proportioning determined by the signal director module. The signal director module may direct the signal divider to decrease a proportion of the command signal passing to the in-phase speaker controller, while increasing a proportion of the command signal passing to the arrayed speaker controller, in real time response to an decrease in the magnitude measured by the signal magnitude monitor.

A gain applied by the amplifier to the in-phase driver signal for all of the speakers may be inversely proportional to a number of the speakers.

The noise cancellation system may further comprise an adder combining each driver signal with the in-phase driver signal to produce a hybrid command signal for each speaker before that hybrid command signal passes to the amplifier. The hybrid command signals may be derived from the command signal produced by the system controller.

In another aspect, a method for attenuating noise is provided. The method comprises producing a command signal in response to a signal from at least one microphone detecting sound in an area, proportioning the command signal between an arrayed speaker controller and an in-phase speaker controller in response to a magnitude of voltage associated with driving a plurality of speakers in accordance with the command signal, and producing, by the arrayed speaker controller, when a first portion of the command signal is proportioned to the arrayed speaker controller, a driver signal for each of the speakers in response to the first portion of the command signal such that combined sound emitted by the speakers in response to the driver signals produces a substantially uniform sound pressure field having a magnitude and phase adapted to attenuate a noise field corresponding to the sound detected by the at least one microphone. The method further comprises producing, by the in-phase speaker controller, when a second portion of the command signal is proportioned to the in-phase speaker controller, a common in-phase driver signal for all of the speakers in response to second portion of the command signal.

Embodiments of the method may include one of the following features, or any combination thereof.

The method may further comprise measuring the magnitude of voltage associated with driving the speakers in accordance with the command signal, and changing the proportioning of the command signal between the arrayed speaker controller and the in-phase speaker controller in real time response to the magnitude measured.

The method may further comprise transitioning to proportioning all of the command signal to the in-phase speaker controller, with none of the command signal being proportioned to the arrayed speaker controller, in real time response to the measured magnitude exceeding a threshold. The transitioning to proportioning all of the command signal to the arrayed speaker controller, with none of the command signal being proportioned to the in-phase speaker controller, may occur in real time response to the measured magnitude dropping below a threshold.

The method may further comprise increasing a proportion of the command signal passing to the in-phase speaker controller, while decreasing a proportion of the command signal passing to the arrayed speaker controller, in real time response to an increase in the magnitude measured, or decreasing a proportion of the command signal passing to the in-phase speaker controller, while increasing a proportion of the command signal passing to the arrayed speaker controller, in real time response to an decrease in the magnitude measured.

The method may further comprise applying a gain to the in-phase driver signal for all of the speakers that is inversely proportional to a number of the speakers, or combining each driver signal with the in-phase driver signal to produce a hybrid command signal for each speaker.

In another aspect, a vehicle comprises a passenger compartment, and a noise cancellation system comprising a plurality of speakers disposed within an area in the passenger compartment, an amplifier in communication with the speakers, and a system controller, in communication with the amplifier, producing a command signal in response to a signal from at least one microphone detecting sound in the area. The system controller includes an arrayed speaker controller configured to produce a driver signal for each of the speakers in response to the command signal such that combined sound emitted by the speakers in response to the driver signals produces a substantially uniform sound pressure field having a magnitude and phase adapted to attenuate a noise field corresponding to the sound detected by the at least one microphone. The system controller further includes an in-phase speaker controller configured to produce a common in-phase driver signal for all of the speakers in response to the command signal, and a signal director module configured to proportion the command signal between the arrayed speaker controller and the in-phase speaker controller in response to a magnitude of voltage associated with driving, by the amplifier, the speakers in accordance with the command signal.

Embodiments of the system may include one of the following features, or any combination thereof.

The vehicle may further comprise a signal magnitude monitor measuring magnitude of voltage associated with the amplifier driving the speakers in accordance with the command signal. The signal director module may change the proportioning of the command signal between the arrayed speaker controller and the in-phase speaker controller in real time response to the magnitude measured by the signal magnitude monitor. The signal director module may transition to proportioning all of the command signal to the in-phase speaker controller, with none of the command signal being proportioned to the arrayed speaker controller, in real time response to the measured magnitude exceeding a threshold. The signal director module may transition to proportioning all of the command signal to the arrayed speaker controller, with none of the command signal being proportioned to the in-phase speaker controller, in real time response to the measured magnitude dropping below a threshold.

The vehicle may further comprise a signal divider for dividing the command signal in accordance with the proportioning determined by the signal director module. The signal director module may direct the signal divider to increase a proportion of the command signal passing to the in-phase speaker controller, while decreasing a proportion of the command signal passing to the arrayed speaker controller, in real time response to an increase in the magnitude measured by the signal magnitude monitor, or the signal director module may direct the signal divider to decrease a proportion of the command signal passing to the in-phase speaker controller, while increasing a proportion of the command signal passing to the arrayed speaker controller, in real time response to an decrease in the magnitude measured by the signal magnitude monitor.

A gain applied by the amplifier to the in-phase driver signal for all of the speakers may be inversely proportional to a number of the speakers. The vehicle may further comprise an adder combining each driver signal with the in-phase driver signal to produce a hybrid command signal for each speaker before that hybrid command signal passes to the amplifier. The hybrid command signals may be derived from the command signal produced by the system controller.

BRIEF DESCRIPTION OF THE DRAWINGS

The above and further features and advantages may be better understood by referring to the following description in conjunction with the accompanying drawings, in which like numerals indicate like structural elements and features in various figures. The drawings are not necessarily to scale, emphasis instead being placed upon illustrating the principles of features and implementations.

DETAILED DESCRIPTION

Figure 1:
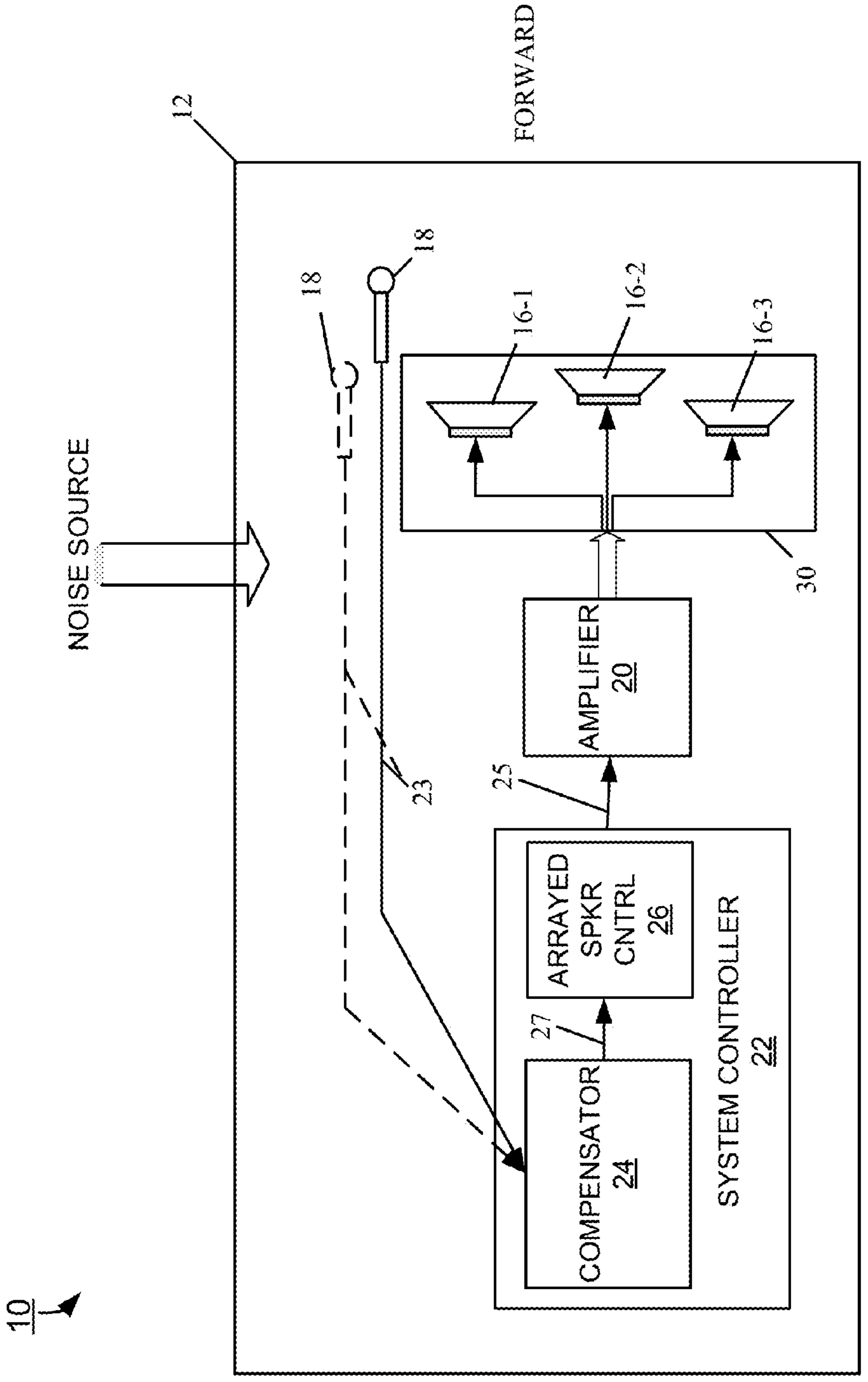
FIG. 1 is a diagram of an environment having an example noise cancellation system installed therein.

Conventional noise cancellation systems generally use feedback from a microphone picking up noise to control a speaker such that the sound from the speaker cancels the noise at the microphone. Applicant recognized a mismatch existed between the noise field in which the occupant was immersed and the driver field produced by the speaker. Whereas the noise field was generally spatially flat (i.e., the sound pressure field or spectral density was relatively constant around the head of the occupant), the driver field decreased rapidly from the speaker location, similarly to a 1/r (1/radius) response. Noise cancellation occurred at the line of intersection of the noise field and driver field, which amounted to a small region near the ears of the occupant. Outside of that region, the noise cancellation system could produce a disagreeable sensation whenever the occupant turned her head sideways to one side or the other.

Active noise cancellation systems described herein increase the area of a noise cancellation zone around the head of the occupant in comparison to such above-noted noise cancellation systems by producing a sound pressure field that closely matches the noise field in magnitude but with inverted phase over a relatively large spatial region. Each active noise cancellation zone includes at least one system microphone and a plurality of speakers. In general, a system microphone measures pressure at a point and feeds that measurement to a controller. In one example configuration, the speakers are arrayed. As used herein, "arrayed speakers" refers to a specific relationship among the speakers that has been pre-determined, in terms of magnitude and phase, such that the speakers together produce a substantially spatially flat sound pressure field. In addition, as used herein, a uniform driver field or a uniform noise field refers to a field with a power spectrum that does not vary substantially, spatially, across a given area. (The power spectrum may vary spectrally while being uniform spatially). One skilled in the art will recognize that a perfectly uniform sound pressure field rarely occurs in practice; some variations in amplitude are expected across the zone; hence, the driver field and noise field may be referred to as being substantially or approximately uniform or substantially or approximately flat.

In one example configuration, the plurality of speakers includes three speakers disposed within a vehicle headrest and arranged in a row: one speaker at the left-hand side of the headrest, one speaker in the center, and one on the right-hand side of the headrest. Each system microphone measures sound near or within the noise cancellation zone and provides a signal to a system controller. The system controller drives the speakers, which are arrayed to produce a substantially uniform (i.e., flat) driver field that closely matches the noise field in magnitude with the opposite phase within the cancellation zone. The matching of the driver field to the noise field increases the breadth and length of the noise cancellation zone around the head of the occupant by increasing the extent of the intersection region between the noise field and driver field.

Driving the speakers in an arrayed configuration generally produces satisfactory noise cancellation for an occupant whose head is within the cancellation zone. However, to achieve the flat driver field, some of the output from one speaker cancels the output of the others, making the arrayed system less efficient as a result. Satisfactory results notwithstanding, applicant recognized certain noise-related events, for example, driving a vehicle over a crack or a tar strip in the road, could cause the system controller to produce a high output (voltage) that resulted in audible amplifier clipping. To avoid the audible clipping, some examples of noise cancellation systems transition from driving the speakers in an arrayed configuration mode to an in-phase configuration mode, which has no cancellation between speakers and is, therefore, efficient relative to the arrayed configuration mode, in real-time response to detection of a certain noise-related event. As used herein, speakers driven in a "in phase" configuration mode means that all of the speakers are being driven with the same command signal. Because driving the speakers in the in-phase configuration mode has a smaller zone of noise cancellation than the arrayed configuration mode, the transition is momentary to avoid audible artifacts, and the noise cancellation system can transition back to the arrayed configuration mode in real-time after the certain noise-generating event ceases.

FIG. 1 shows a generalized example of an environment 10 having a noise cancellation system 12 installed therein for attenuating or canceling noise within the environment. The principles described herein apply to feed-forward and feedback noise cancellation systems. The noise cancellation techniques described herein can extend to a variety of specific environments, whether such environments are open or enclosed. For example, the deployment of the noise cancellation system 12 can be in vehicles (e.g., automobiles, trucks, buses, trains, airplanes, boats, and vessels), living rooms, movie theatres, auditoriums; in general, anywhere the strategic placement of arrayed speakers can achieve noise cancellation for the occupants of such environments, as described below. In vehicles, for example, the noise cancellation system 12 can serve to attenuate low frequency (e.g., 40 Hz-200 Hz) road noise, advantageously reducing any need to add weight to certain regions of the vehicle for this purpose.

In the example shown, the noise cancellation system 12 includes a plurality of speakers 16-1, 16-2, 16-3 (in general, speaker 16), one or more microphones 18, an amplifier 20, and a system controller 22. The system controller 22 is in communication with the one or more system microphones 18 to receive signals 23 therefrom and with the amplifier 20 to send driver signals 25 thereto in response to the signals. The amplifier 20 is in communication with the plurality of speakers 16 to drive each speaker 16 in accordance with the driver signals 25.

In this example, the speakers 16 are arrayed. The arrayed speakers 16 may be incorporated together in a single unit 30, for example, in a headrest of a vehicle (e.g., facing the occupant from behind the occupant's head), or distributed apart (e.g., in a ring of speakers around the occupant), or some together and others apart (e.g., two speakers on the forward-facing side of a headrest, and another speaker on the rear-facing side of another headrest in front of the occupant). All speakers may be on the same plane (horizontal or vertical), that is, an imaginary plane passes through the center of all speakers.

In one example configuration, the plurality of speakers 16 has three speakers 16-1, 16-2, 16-3. All of the speakers 16 are disposed behind the head of an occupant; the speakers 16 face forward towards the occupant and are on the same imaginary horizontal plane. The speaker 16-1 on the left is spatially aligned with the speaker 16-3 on the right (they are equidistant from the forward facing side of the unit 30). The speaker 16-2 is displaced by a predetermined distance, being closer to the forward facing side of the unit 30 than the speakers 16-1, 16-3 on opposite sides of the speaker 16-2. With the unit 30 behind the head of the occupant, the center speaker 16-2 is closer to the head than the other two outside speakers 16-1, 16-3. The center speaker 16-2 is closer to the head because simulations show this arrangement producing a more uniform pressure field than having all speakers 16 arranged in a row.

The one or more system microphones 18 are disposed within the environment 10 to be occupied by an individual. Each system microphone 18 can detects sound in the listening area and, in response, produce a signal. In response to the signal, the system controller 22 produces a command signal that is sent to the arrayed speakers. The arrayed speakers are designed such that the acoustic transfer function from the speakers to the system microphone 18 matches the acoustic transfer function measured from the speakers to various points within the desired noise cancellation zone. In general, an acoustic transfer function corresponds to a measured response at a given location to a source of sound (e.g., a speaker) at another location. This measured response captures the relationship between the output (i.e., the sound detected at a given location) and the input (i.e., driver voltage). The measured relationship is a function of frequency and has magnitude and phase components.

In one example configuration, each microphone 18 is located within the environment 10 where the acoustic transfer function for sound radiating from the plurality of speakers 16 to the location of that microphone 18 is substantially equal to the acoustic transfer function for the sound from the plurality of speakers 16 to an ear of the occupant. An example technique for identifying such locations for microphones is described in U.S. application Ser. No. 14/449,325, filed Aug. 1, 2014, titled "System and Method of Microphone Placement for Noise Attenuation," the entirety of which is incorporated by reference herein.

The system controller 22, which may be embodied in the amplifier 20, includes a compensator 24 in communication with an arrayed speaker controller 26. The compensator 24 produces a command signal 27 based on the one or more signals 23 received from the one or more system microphones 18.

In general, the arrayed speaker controller 26 uses the command signal 27 received from the compensator 24 to produce driver signals 25 adapted to produce a spatially flat driver field. The compensator 24, when computing the command signal 27, does not account for the operation of the arrayed speaker controller 26; the algorithm executed by the compensator 24 produces the command signal 27 irrespective of whether the speakers are configured as arrayed or in-phase. Based on the command signal 27, the arrayed speaker controller 26 produces a separate driver signal 25 for each speaker 16 of the plurality of speakers. The driver signals 25 are tailored to drive the speakers 16 such that the speakers 16 produce a spatially flat driver field of a particular magnitude and phase to cancel the noise field. The arrayed speaker controller 26 sends these driver signals 25 to the amplifier 20 to drive the speakers 16 accordingly.

Figure 2:
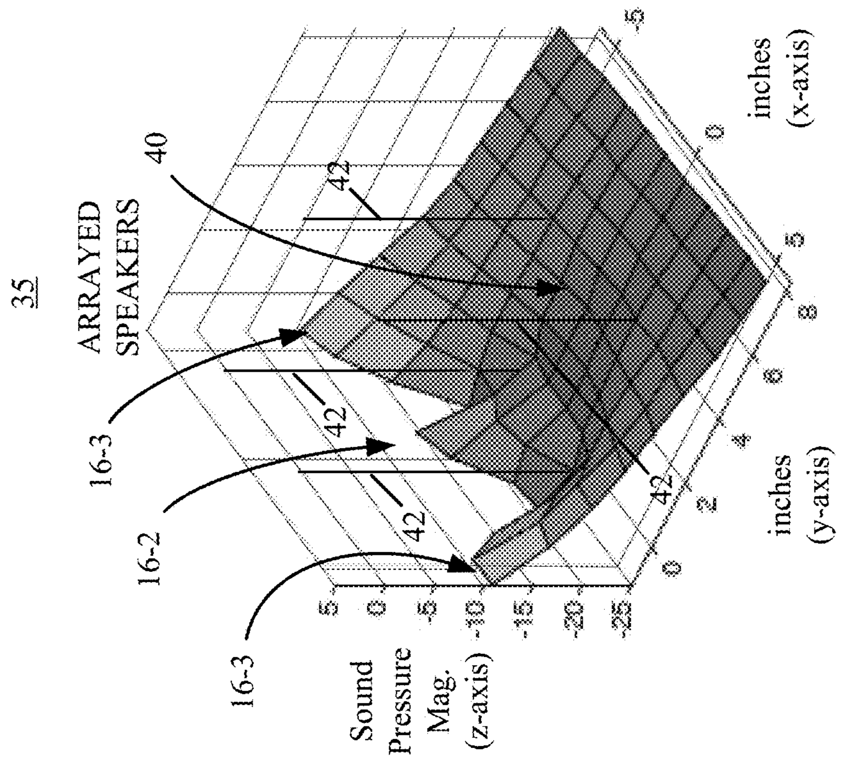
FIG. 2 is a graph illustrating a substantially uniform sound pressure field generated by three arrayed speakers.

FIG. 2 shows a three-dimensional graph 35 of an example of a substantially uniform (flat) sound pressure field 40 that may be produced by the arrayed speakers 16 driven with equal amplitude voltages. Sound pressure magnitude in dB (referenced to an arbitrary pressure) is measured on the vertical axis (z-axis) and distance (in inches) is measured on the x- and y-axes. Four vertical lines 42 correspond to temporary locations of four test microphones, used to define the field 40 for which a substantially constant (i.e., uniform) sound pressure magnitude is desired, as described in more detail in connection with FIG. 4. The test microphones do not remain in these positions when the noise cancellation system 12 is operating. The approximate positions of the speakers 16-1, 16-2, and 16-3 coincide generally with the three major peaks in the graph 35. From each of these peaks, the sound pressure magnitude drops precipitously and levels off at the substantially flat sound pressure field 40. In this example, the x- and y-dimensions of the flat sound pressure field 40 are approximately 4.5 inches by 4.5 inches, and starts immediately in front at the center speaker 16-2. The flat sound pressure field 40, which is designed to intersect and cancel the substantially flat noise field, corresponds to the noise cancellation zone.

Figure 3:
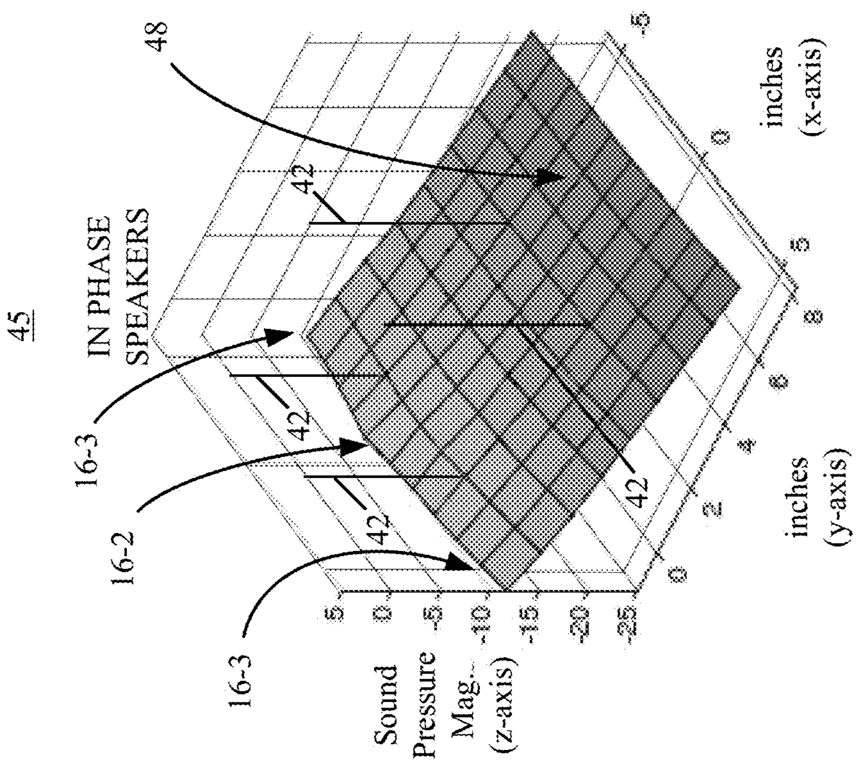
FIG. 3 is a graph illustrating a decreasing sound pressure field generated by three speakers driven in phase with the same command signal.

FIG. 3 shows a three-dimensional graph 45 of an example of a sound pressure field 48 that may be produced by the speakers 16 driven in-phase with equal amplitude voltages. Similar to FIG. 2, sound pressure magnitude in dB (referenced to an arbitrary pressure) is measured on the vertical axis (z-axis) and distance (in inches) is measured on the x- and y-axes. The four vertical lines 42, corresponding to the temporary locations of the four test microphones, are shown only to provide reference points for comparing the graph 35 of FIG. 2 with the graph 45. The approximate positions of the speakers 16-1, 16-2, and 16-3 are also shown. From peak levels at these speaker locations, the sound pressure magnitude decreases steadily with increasing distance from the speakers. Driving the speakers 16 in an in-phase configuration is generally sub-optimal because the sound pressure field 48 is sloped relative to a generally flat noise field, and thus produces a relatively small region of cancellation (i.e., along a line where the noise field and the driver field intersect) in comparison to the intersection region produced by the flat sound pressure field 40 of FIG. 2. Notwithstanding, an in-phase configuration can provide a higher response than an arrayed configuration for the same driver voltage.

Figure 4:
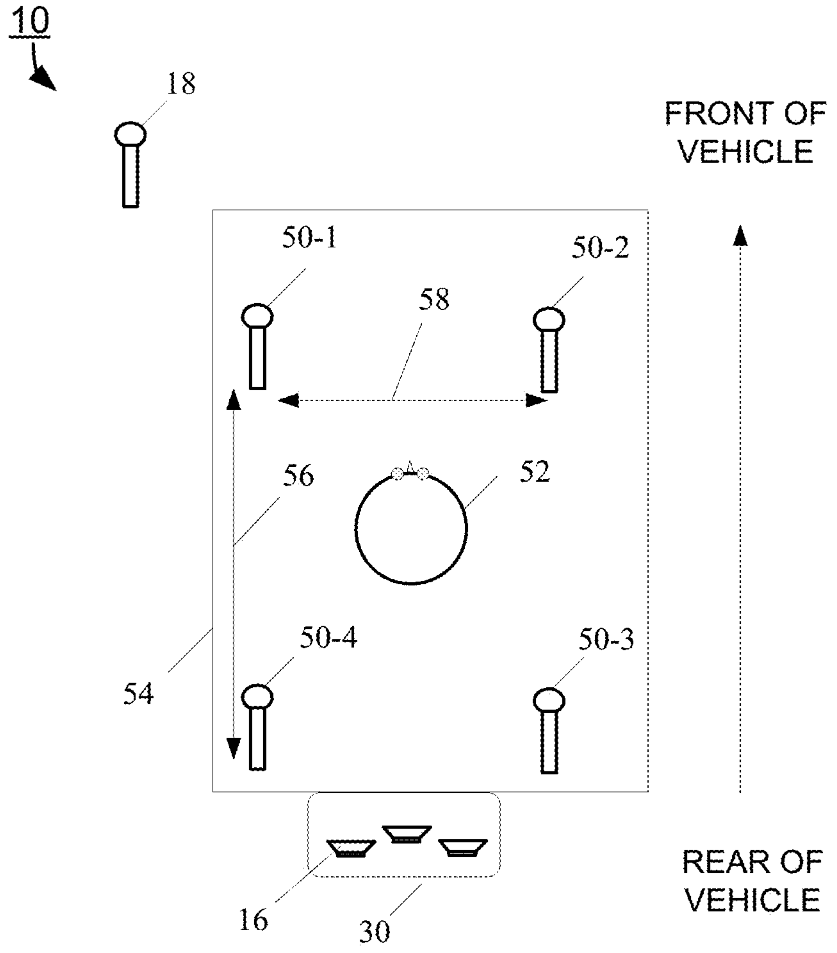
FIG. 4 is a diagram illustrating an example process for determining driver signals to drive arrayed speakers.

FIG. 4 illustrates an example process by which the arrayed speaker controller 26 is pre-configured to modify an incoming command signal 27 to produce a driver signal 25 for each of the speakers 16 that achieves the desired flat driver field. The process entails placing four test microphones 50-1, 50-2, 50-3, and 50-4 (generally, 50), spaced apart, within the environment 10 surrounding the expected head region 52 of the occupant. The locations of the test microphones 50 approximately define a two-dimensional noise cancellation zone 54 within which to produce the desired flat driver field. The microphones 50-1 and 50-3 together correspond to a position of the head of the occupant turned 45 degrees to the right, and the microphones 50-2 and 50-4 together correspond to a position of the head of the occupant turned 45 degrees to the left.

An optimization routine (algorithm) measures a frequency response from the input of the arrayed speaker controller 26 to each of the microphones 50. The objective of the optimization routine is to find a transformation (e.g., gain and delay) to be applied to the driver signals 25 such that the frequency response (in magnitude and phase) from the input of the arrayed speaker controller 26 to all of the test microphones 50 is substantially the same. Accordingly, the perceptible effect of noise cancellation becomes the same throughout the noise cancellation zone 54.

In one example implementation, the optimization routine computes the set of driver signals 25 by using a fixed gain for one of the three speakers (e.g., 16-1) and three free parameters for the other two speakers (e.g., 16-2, 16-3). The three free parameters correspond to the two gains for each of the other two speakers (e.g., 16-2, 16-3) and a delay for one of the other two speakers (e.g., 16-2, 16-3). One example solution produced by the optimization routine applies a fixed gain of 1 to the command signal 27 to produce the driver signal 25 sent to the left speaker 16-1, a gain of approximately −1 and a delay to produce the driver signal 25 sent to the center speaker 16-2, and a gain of 1 to produce the driver signal 25 sent to the right speaker 16-3. The optimization routine takes into account the physical displacement of the center speaker 16-2. The side speakers 16-1, 16-3 operate in phase; accordingly, the outputs of the side speakers 16-1, 16-3 sum. The center speaker 16-2 acts individually. Having the center speaker 16-2 closer to the head of the occupant than the side speakers 16-1, 16-3 has a flattening effect on the driver field. The arrayed speaker controller 26 is preconfigured with the solution produced by the optimization routine, to be used during operation of the noise cancellation system 12 to produce the driver signals 25 based on the command signal 27 received from the compensator 24.

It is to be understood that the optimization routine can use other parameters instead of, or in addition to, gain and delays, examples of which include, but are not limited to, linear and non-linear filters, pole frequencies, and zero frequencies.

Figure 5:
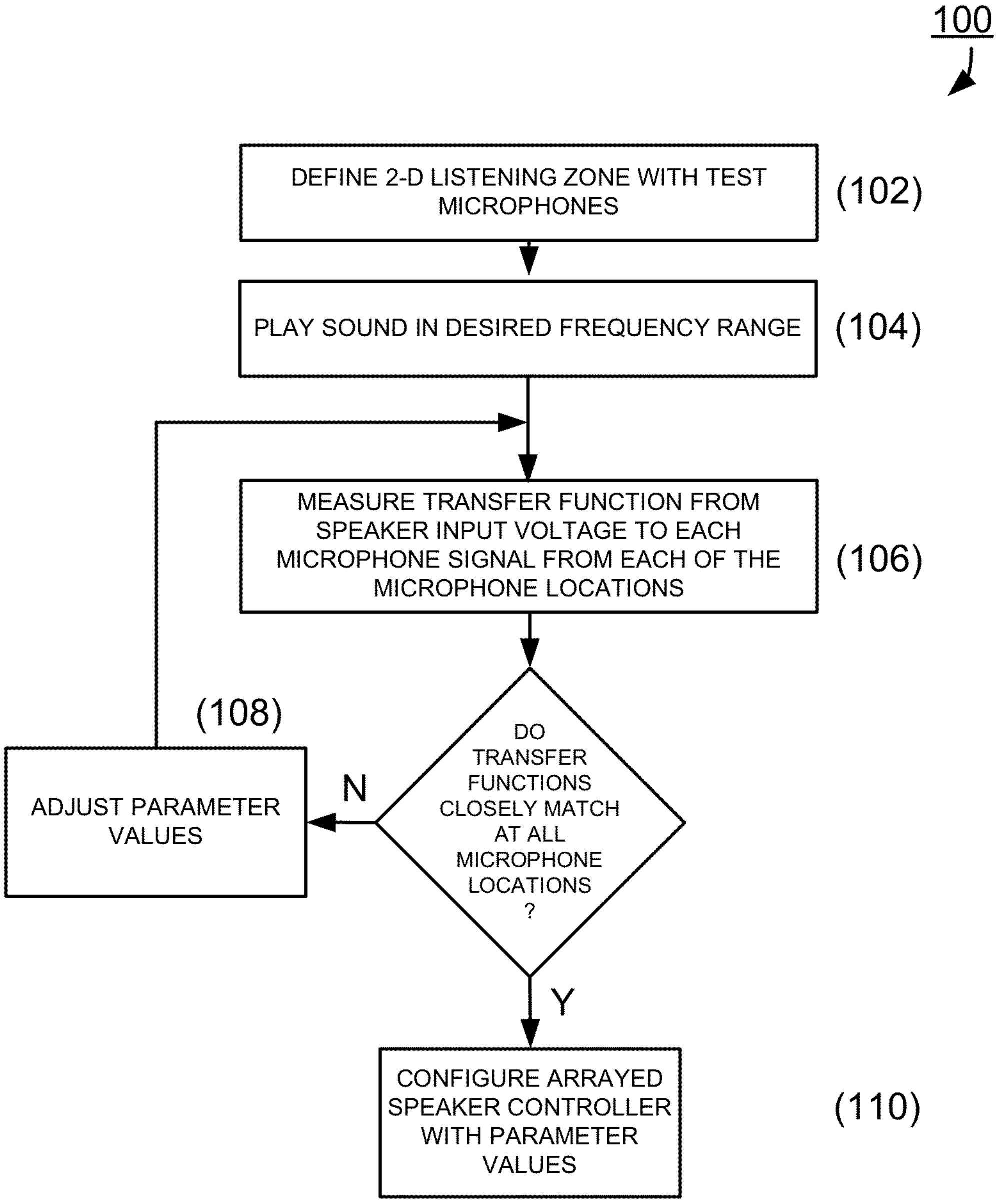
FIG. 5 is a flow diagram illustrating an example process for configuring the noise cancellation system to drive arrayed speakers in order to produce a substantially uniform sound pressure field.

FIG. 5 shows an example of a process 100 for configuring the noise cancellation system 12 with parameter values to be applied to the command signal 27 to produce the driver signals 25 used to drive the speakers 16 in order to cancel noise at the head of an occupant of an area, for example, within the cabin of a vehicle. In the description of the process 100, reference is made to the elements of FIG. 1. The process 100 includes defining (step 102) a two-dimensional noise cancellation zone 54 to be occupied by a prospective occupant and within which to produce a desired flat driver field. To define this zone, at least three test microphones 50 are placed in front of the speakers 16, spatially separated to produce a two-dimensional area (e.g., an isolateral triangle, a rectangle, a parallelogram). The locations of the three speakers 16 preferably correspond to the expected locations of the speakers during the operation of the noise cancellation system 12.

The speakers 16 emit (step 104) sound having a range of frequencies of interest (i.e., the original form of this audio signal is predetermined). For example, the design of the noise cancellation system 12 can be to attenuate low-frequency noises (5-150 Hz), and the audio signal contains frequencies that span a desired frequency range. A transfer function (i.e., its magnitude and phase response) is measured (step 106) from the input of the amplifier 20 to each of the test microphones 50. The optimization routine adjusts (step 108) certain parameters of the arrayed speaker controller 26 driving the speakers 16, to converge on a set of parameter values that produce approximately the same frequency response, in magnitude and phase, across the desired frequency range, from the speakers 16 to all of the test microphones 50. The solution arrived at by the optimization routine achieves generation, by the speakers, of a substantially flat driver field that closely matches a substantially flat noise field within the cancellation zone. The arrayed speaker controller 26 is configured (step 110) with the parameter values (e.g., gains and delay) arrived at by the optimization routine for use driving the speakers 16 during the operational stage.

Figure 6:
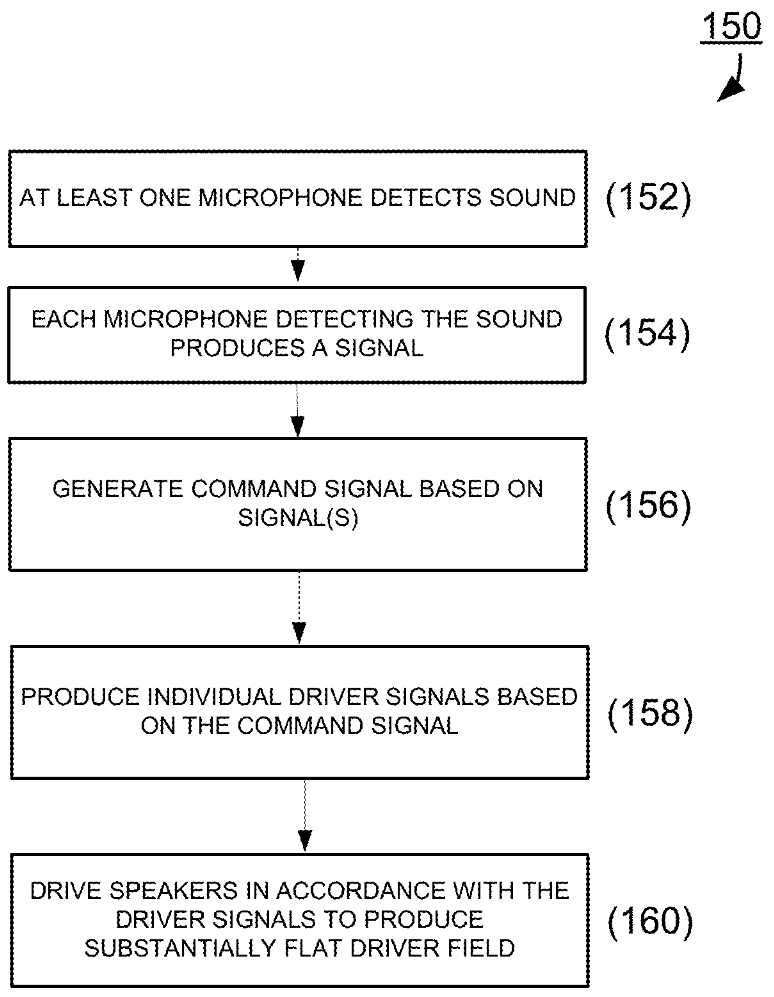
FIG. 6 is a flow diagram of an example process for cancelling noise.

FIG. 6 shows an example of a process 150 for providing noise cancellation within the noise cancellation zone 54 defined as described in connection with FIG. 5. In the description of the process 150, reference is made to the elements of FIG. 1. During operation of the noise cancellation system 12, at least one system microphone 18, disposed near the area to be occupied, detects (step 152) sound, which may include frequency components deemed noise. In response to the sound, each microphone 18 produces (step 154) a signal.

In response to the signal (or signals) from the at least one system microphone 18, the compensator 24 of the system controller 22 executes (step 156) an algorithm that generates a command signal 27. An objective of the algorithm is to achieve a noticeable reduction (e.g., at least 4 dB) at the occupant's ears. In general, the executed algorithm applies one or more filters to the signal produced by each system microphone 18. In the instance of multiple microphones 18, the executed algorithm can apply a different filter to the signal produced by each microphone 18, and combine the results to produce the command signal. An applied filter can be digital or analog, linear or non-linear.

The arrayed speaker controller 26 of the system controller 22 receives the command signal 27 and produces (step 158) a set of driver signals in response to the command signal 27. Each driver signal 25 is associated with a different one of the speakers 16. With arrayed speakers, at least two of the speakers receive different driver signals 25 (e.g., different gain, delay, or both); typically, all of the speakers receive a different driver signal 25. The arrayed speaker controller 26 sends the driver signals 25 to the amplifier 20. The amplifier 20 drives (step 160) each speaker 16 in accordance with the driver signal associated with that speaker. The sound emitted by the speakers 16 together produces a substantially flat sound pressure field inverse (i.e., approximately equal in magnitude and out-of-phase by 180 degrees) to the substantially flat noise field corresponding to the noise detected by the at least one system microphone 18.

Figure 7:
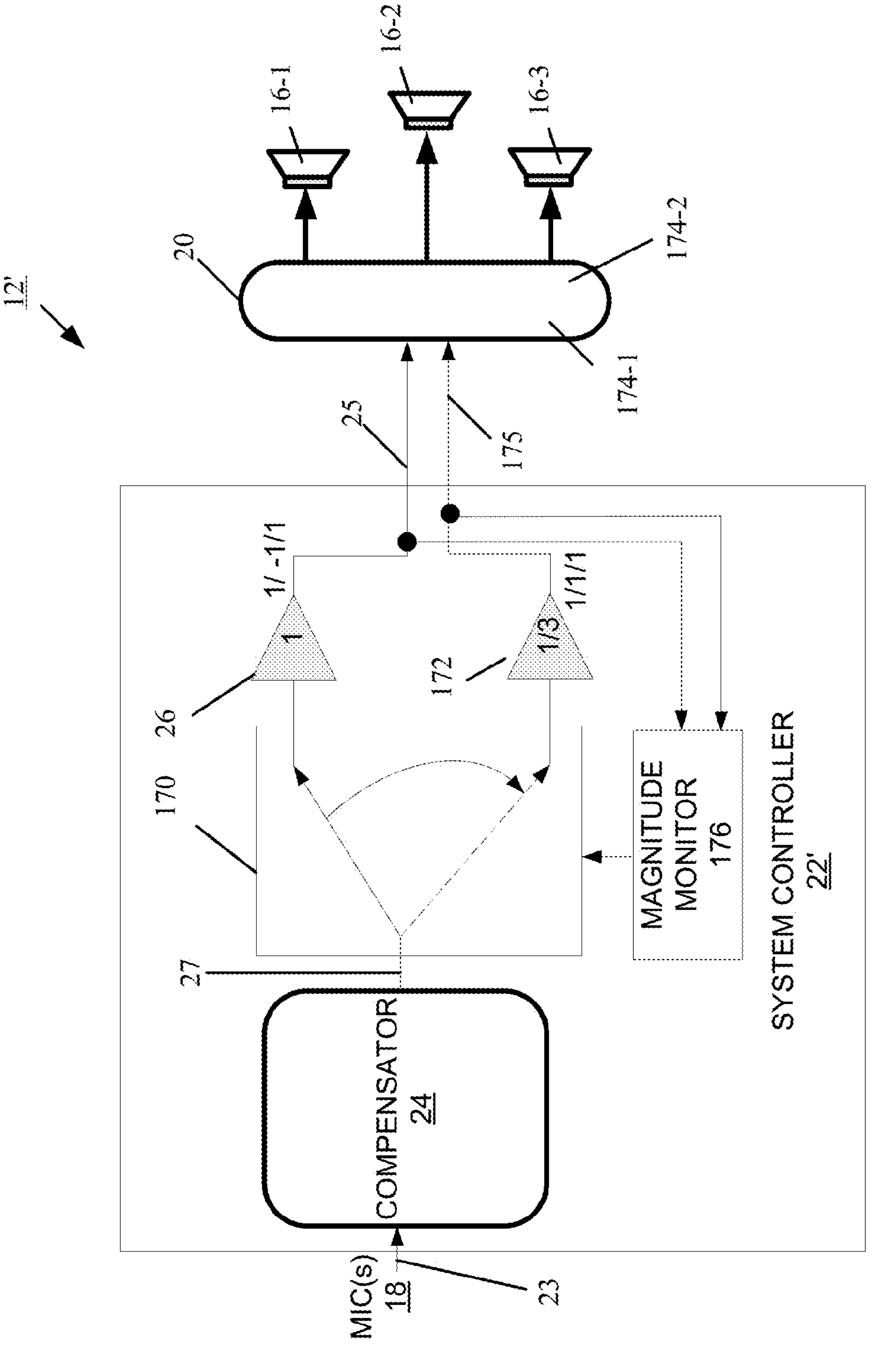
FIG. 7 is a block diagram of an example noise cancellation system that switches between arrayed and in-phase speaker configurations.

FIG. 7 shows an example of a noise cancellation system 12' adapted to transition back and forth between arrayed and in-phase speaker configurations. The noise cancellation system 12' includes a system controller 22' in communication with an amplifier 20. The amplifier 20 is in communication with the plurality of speakers 16-1, 16-2, and 16-3, positioned as described in connection with FIG. 1.

The system controller 22' includes the compensator 24 in communication with a switch 170 (also considered a signal director module). The compensator 24 produces a command signal 27 based on one or more signals 23 received from one or more system microphones 18. The switch 170 is in communication with the arrayed speaker controller 26 and an in-phase speaker controller 172. In a first state, the switch 170 passes the command signal 27 received from the compensator 24 to the arrayed speaker controller 26 in its entirety; the in-phase speaker controller 172 does not receive any portion of the command signal 27. In a second state, the switch 170 passes the command signal 27 in its entirety to the in-phase speaker controller 172; the arrayed speaker controller 26 does not receive any portion of the command signal 27.

In response to receiving the command signal 27, the arrayed speaker controller 26 produces individual driver signals 25 for each of the speakers 16, as described previously in connection with FIG. 1, in order to produce a flat sound pressure field. The amplifier 20 receives the driver signals 25 and drives each speaker in accordance with the driver signal 25 for that speaker.

An example of the gains 174-1 applied to the driver signals 25 to produce a flat sound pressure field include a gain of 1 for the left speaker 16-1, a gain of −1 for the center speaker 16-2 (and a delay), and a gain of 1 for the right speaker 16-3. The net sum of these gains equals one speaker (1+(−1)+1).

Cancellation of noise events with large pressure amplitudes requires equally large pressures from the speakers 16; the relatively low pressure response of arrayed speakers to driver voltages results in clipping when the amplifier output voltage reaches its limit. Because the arrayed configuration mode may overdrive the amplifier, the noise cancellation system 12' transitions to the in-phase configuration mode when those certain noise-related events occur. Driving the three speakers 16-1, 16-2, 16-3 in the in-phase configuration mode increases the acoustic gain by a factor of three. Accordingly, the amplifier 20 requires less output voltage to drive the speakers 16 to achieve the noise-cancelling output intended by the compensator 24 when the speakers are the in-phase configuration mode than in the arrayed configuration mode. In response to the command signal 27, the in-phase speaker controller 172 produces a common in-phase driver signal 175 to be sent to all of the speakers 16, with the in-phase speaker controller 172 applying a ⅓ gain for each speaker 16. Like the arrayed configuration mode, the net sum of the gains is one speaker (⅓+⅓+⅓), but the voltage required to achieve the noise-cancelling speaker output is one-third that required by the arrayed configuration mode. Accordingly, when operating in the in-phase configuration mode, the amplifier 20 does not clip. It is to be understood that the gains and the net sum of the gains produced by the arrayed speaker controller 26 and in-phase speaker controller 172 are example values provided to illustrate the principles.

The system controller 22' further includes a signal magnitude monitor 176 coupled to the outputs of the arrayed speaker controller 26 and of the in-phase speaker controller 172, and to the switch 170. The signal magnitude monitor 176 causes the switch 170 to direct the command signal 27 to the in-phase speaker controller 172, in response to detecting a noise-related event that may cause the arrayed speaker controller 26 to overdrive the amplifier 20 and cause clipping. The signal magnitude monitor 176 monitors the output of the arrayed speaker controller 26, comparing the magnitude of the driver signals 25 with a threshold value, and initiates a transition from the arrayed configuration to the in-phase configuration when the magnitude exceeds the threshold. In response to the passage of a predetermined period, or to the monitored output of the in-phase speaker controller 172 falling below a predetermined threshold value, the signal magnitude monitor 176 causes the switch 170 to transition back to directing the entirety of the command signal 27 to the arrayed speaker controller 26.

Figure 8:
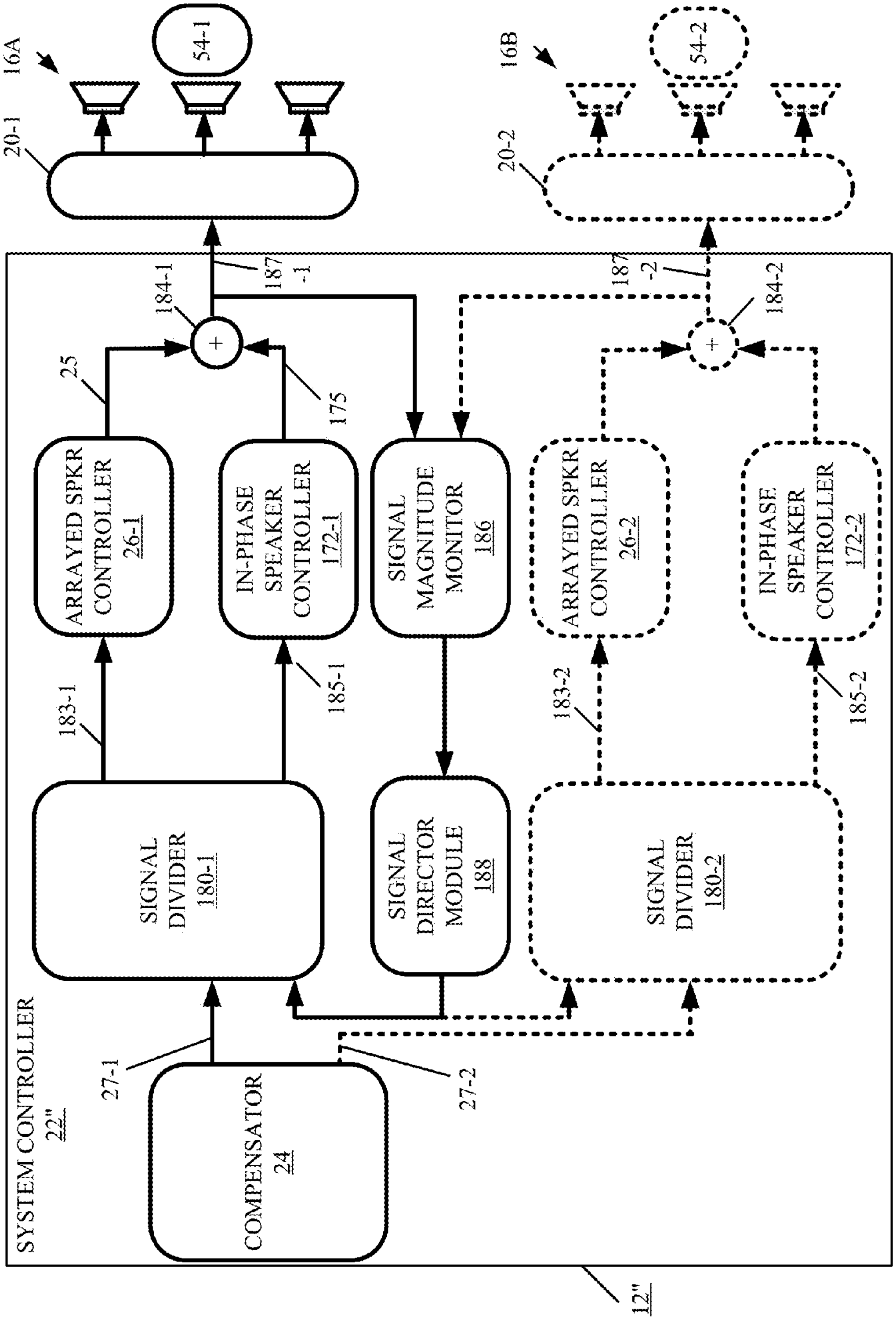
FIG. 8 is a block diagram of an example noise cancellation system that blends arrayed and in-phase speaker configurations depending upon noise-related events.

FIG. 8 is a block diagram of another example of a noise cancellation system 12" adapted to transition between arrayed and in-phase speaker configurations in response to a noise-related event in order to avoid overdriving an amplifier. The noise cancellation system 12" includes a system controller 22" configured to cancel noise in two noise cancellation zones 54-1, 54-2. The components for canceling noise in the noise cancellation zone 54-2 are shown in phantom to signify such features are optional, and that the principles described in connection with FIG. 8 apply to noise cancellation in just a single noise cancellation zone. In general, the noise cancellation system 12" proportions the command signal 27 between the arrayed and in-phase speaker configuration modes, instead of proportioning the command signal 27 in its entirety to one configuration mode or the other as described in FIG. 7.

The system controller 22" is in communication with a first amplifier 20-1 and, optionally, a second amplifier 20-2. Each amplifier 20-1, 20-2 is in communication with a set of speakers 16A, 16B, respectively. The system controller 22" includes a compensator 24 in communication with a first signal divider 180-1 and, optionally, with a second signal divider 180-2. The compensator 24 produces a command signal 27-1 based on one or more signals 23 received from one or more system microphones 18 (not shown) associated with the first zone 54-1 and, optionally, a command signal 27-2 based on one or more signals 23 received from one or more system microphones 18 (not shown) associated with the second noise cancellation zone 54-2. The command signal 27-1 passes to the signal divider 180-1, and, optionally, the command signal 27-2 passes to the signal divider 180-2.

In one example implementation, the signal divider 180-1 includes a bandwidth modulated filter that extracts an arrayed speaker signal 183-1 from the command signal 27, and passes the arrayed speaker signal 183-1 to the arrayed speaker controller 26-1 and the cut-off frequency of the high-pass filter is modulated by the output of the signal director module 188. The signal divider 180-1 can use the high-pass filter to pass the higher frequencies of the command signal 27 to the arrayed speaker controller 26-1. The signal divider 180-1 creates complementary high-pass and low-pass filters for sending the higher frequencies to the arrayed speaker controller 26-1 and the lower frequencies to the in-phase speaker controller 172-1. The signal divider 180-1 can have other implementations, such as a frequency independent gain adjustment, where a certain percentage of the signal is sent to the arrayed speaker controller 26-1 and the rest is sent to the in-phase speaker controller 172-1.

The arrayed speaker controller 26-1 applies the preconfigured parameter values to the arrayed speaker signal 183-1 to generate a set of driver signals 25 (one for each speaker) designed to produce a flat driver field, as described in FIG. 1.

The signal divider 180-1 also produces an in-phase speaker signal 185-1 from the command signal 27-1. The in-phase speaker controller 172-1 applies a ⅓ gain to the in-phase speaker signal 185-1 to produce an in-phase driver signal 175 for each speaker 16 (the same driver signal 175), as described in FIG. 7.

An adder 184-1 combines the set of driver signals 25 from the arrayed speaker controller 26-1 with the in-phase driver signal 175, producing a hybrid command signal 187 for each speaker 16. The sum of these hybrid command signals 187-1 equals the command signal 27-1 produced by the compensator 24.

The connectivity among, and operation of, the components that cancel noise in the second noise cancellation zone 54-2, namely, the signal divider 180-2, adder 184-2, the arrayed speaker controller 26-2, and in-phase array controller 172-2, are similar to their counterparts involved in canceling noise in the first noise cancellation zone 54-1.

The system controller 22" further includes a signal magnitude monitor 186 in communication with a signal director module 188. In communication with the output of the adder 184-1 and, optionally, with the output of the adder 184-2, the signal magnitude monitor 186 computes a magnitude based on the hybrid command signals 187-1 being passed to the amplifier 20-1, and, optionally, also on the hybrid command signals 187-2 being passed to the amplifier 20-2. In one example implementation, the signal magnitude monitor 186 squares the magnitude of the hybrid command signals 187-1. In another example implementation, the signal magnitude monitor 186 computes the magnitude by multiplying the magnitude of the hybrid command signals 187-1 by the magnitude of the hybrid command signals 187-2. The computed magnitude passes to the signal director module 188.

In response to the computed magnitude, the signal director module 188 determines which portion of the command signal 27-1 passes to the arrayed speaker controller 26-1 and which portion of the command signal 27-1 passes to the in-phase speaker controller 172-1. In general, as the computed magnitude approaches the limits of the amplifier to drive the speakers without clipping, a greater portion of the command signal is directed to the in-phase speaker controller. The signal director module 188 can use the computed magnitude to adjust the corner frequency, for example, used by the signal divider 180-1 to proportion the command signal between the arrayed and in-phase configuration modes. For example, to direct the whole command signal to the arrayed speaker controller 26-1, the corner frequency can be reduced to 0 Hz; conversely, to direct the entirety of the command signal to the in-phase speaker controller 172-1, the corner frequency can be raised to the maximum value for the signal divider 180-1 (e.g., 200 Hz). Accordingly, the signal director module 188 implements a "sliding scale" to determine which range of frequencies of the command signal 27-1 pass to the in-phase speaker controller 172-1 and which range of frequencies passes to the arrayed speaker controller 26-1.

Figure 9:
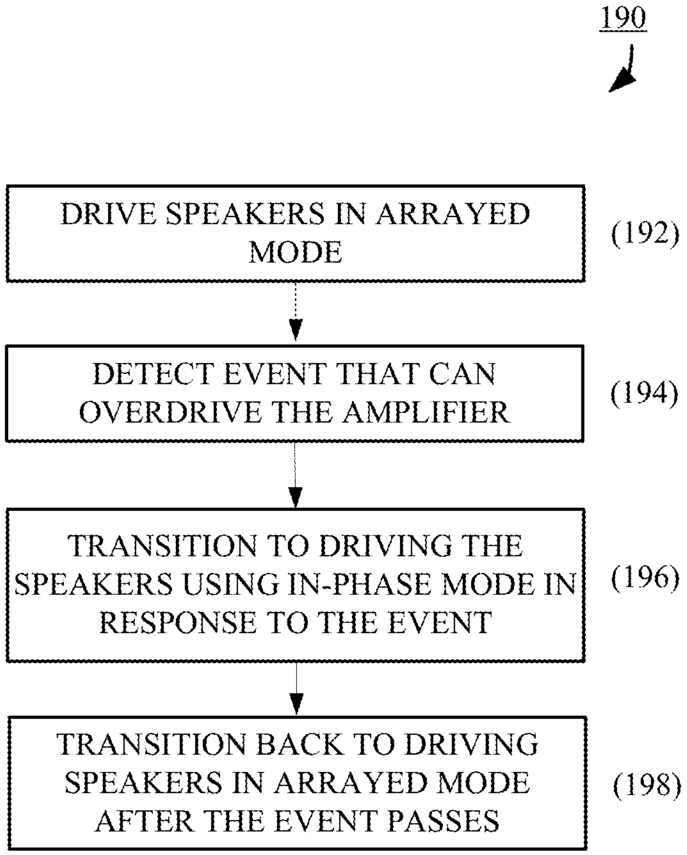
FIG. 9 is a flow diagram of an example process for switching between arrayed and in-phase speaker configurations.

FIG. 9 shows an example process 190 for transitioning between arrayed and in-phase speaker configuration modes. In the description of the process 190, reference is made to the elements of FIG. 7 and FIG. 8. Consider, as a convenient starting point to describe the process 190, that the system controller (22' or 22") is driving (step 192) a set of speakers in an arrayed configuration mode. A certain noise-related event is detected (step 194). In the noise cancellation system 12' of FIG. 7, the signal magnitude monitor 176 may determine that the magnitude of the driver signals 25 exceeds a threshold corresponding to the limit of the amplifier 20 to drive the speakers without clipping. As another example, this noise-related event detection may correspond to the signal director module 188 of the noise cancellation system 12" of FIG. 8 receiving an increased computed magnitude value from the signal magnitude monitor 186.

In response to the detecting of the noise-related event, the system controller adjusts (step 196) the speaker configuration mode in real time. For example, in the noise cancellation system 12' of FIG. 7, the system controller 22' switches to driving all speakers in the in-phase configuration mode in response to the detected noise event. As another example, in the noise cancellation system 12" of FIG. 8, the system controller 22" increases the proportion of the command signal being sent to the in-phase speaker controller 172-1, while conversely decreasing the proportion of the command signal passing to the arrayed speaker controller 26-1.

After the noise-related event ends, the system controller transitions back (step 198) to driving the speakers in the arrayed configuration mode. For example, in the noise cancellation system 12' of FIG. 7, the system controller 22' switches back to driving all speakers in the arrayed configuration mode after the magnitude of the in-phase driver signal 175 falls below a threshold (or after a predetermined period elapses). As another example, in the noise cancellation system 12" of FIG. 8, the system controller 22" can reduce the proportion of the command signal passed to the in-phase speaker controller, while, conversely, increasing the proportion of the command signal passing to the arrayed speaker controller, in real time, in response to a decreased magnitude value computed by the signal magnitude monitor.

In general, the transfer function from the command signal to the system microphone for in-phase speaker configuration closely matches (in phase and magnitude) the transfer function for the arrayed speaker configuration at low frequencies (between 0-350 Hz). This close matching effectively hides from the compensator 24 (i.e., the generator of the command signal) the proportioning of the command signal between the in-phase and arrayed speaker controllers. Irrespective of the particular division of the command signal between the in-phase speaker controller and the arrayed speaker controller, the transfer function to the system microphone is effectively the same; the system controller effectively sees the same plant.

In implementations where changing the proportion of the command signal allotted to arrayed speaker controller and that allotted to the in-phase speaker controller alters the transfer function (i.e., to the effect the system controller now sees a different plant), an adjustment module (e.g., a linear or non-linear filter) can be placed before the array speaker controller, before the in-phase speaker controller, or before both, to ensure the proportion change does not so detrimentally alter the transfer function.

Figure 10:
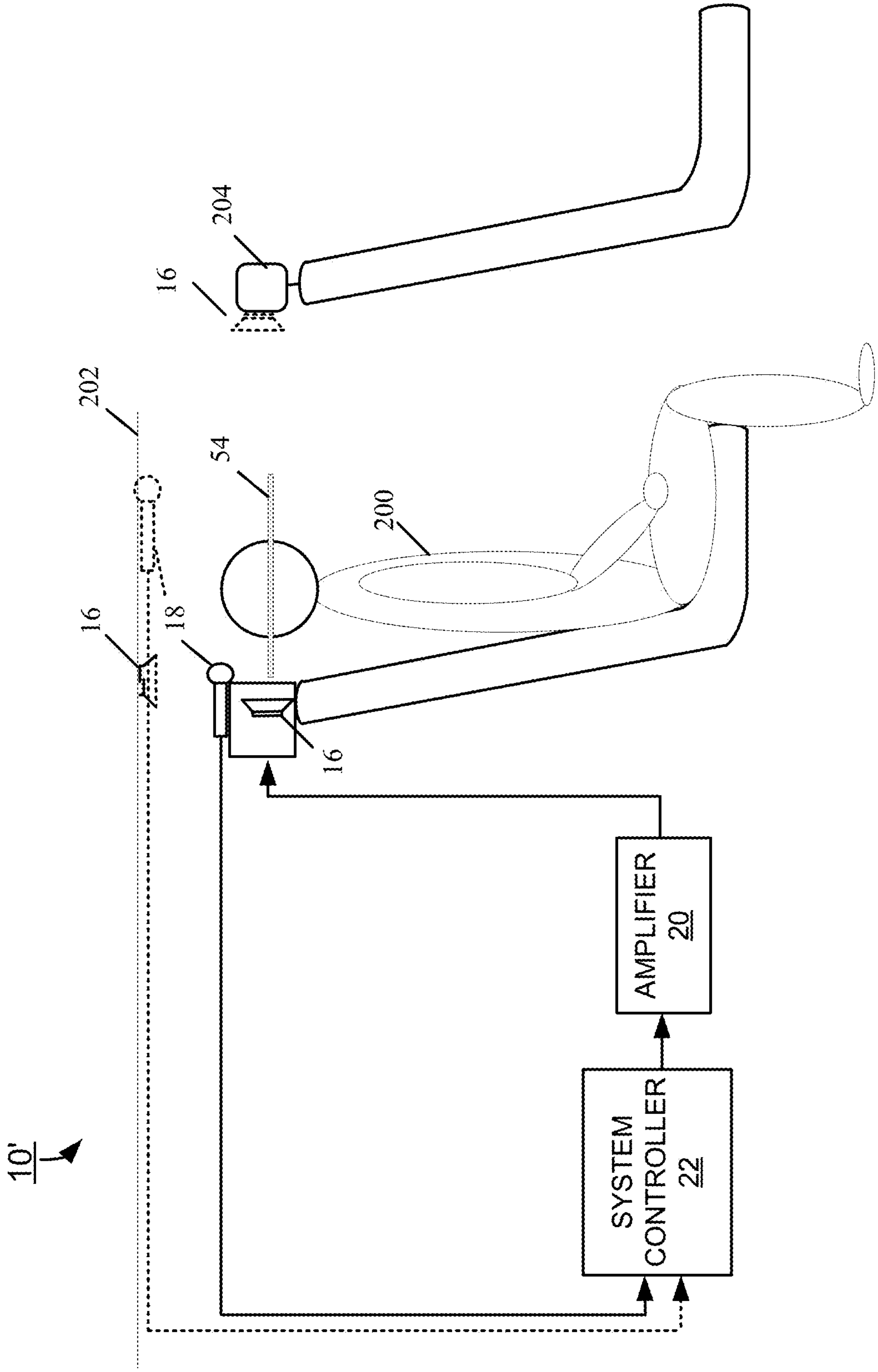
FIG. 10 is a diagram illustrating deployment of a noise cancellation system within an environment relative to an occupant.

FIG. 10 shows an example of an environment 10' in which a noise cancellation system can be deployed. In this example, the plurality of speakers 16 (only one shown) may be disposed behind the head of the occupant 200 within the environment 10', for example, mounted on a headrest, headliner, rear panel, or other interior surface of a vehicle. Other example locations for the speakers may be in the headliner 202 and on the rear-facing side of a headrest 204, provided such speakers are arrayed, as described herein.

One system microphone 18 can be disposed, for example, on the unit 30 containing the speakers 16; another system microphone 18 (shown in phantom) may be disposed in the headliner 202. The amplifier 20 and system controller 22 (having the compensator, arrayed speaker controller, in-phase speaker controller, etc.) may be disposed, for example, in the trunk of the vehicle. The controller 22 is in electrical communication with the one or more system microphones 18 to receive the signal produced by each system microphone.

Examples of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM.

Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims. For example, a ring of speakers equidistant around the occupant can produce a substantially uniform sound pressure field without being arrayed.

What is claimed is:

1. A noise cancellation system comprising:
- a plurality of speakers disposed within an area;
- an amplifier in communication with the speakers; and
- a system controller, in communication with the amplifier, producing a command signal in response to a signal from at least one microphone detecting sound in the area, the system controller including:
  - an arrayed speaker controller configured to produce a driver signal for each speaker in response to the command signal such that combined sound emitted by the speakers in response to the driver signals produces a substantially uniform sound pressure field having a magnitude and phase adapted to attenuate a noise field corresponding to the sound detected by the at least one microphone, an in-phase speaker controller configured to produce a common in-phase driver signal for all of the speakers in response to the command signal; and a signal director module configured to pass an entirety of the command signal to the arrayed speaker controller in response to a first event and pass the entirety of the command signal to the in-phase speaker controller in response to a second event.

2. The noise cancellation system of claim 1, further comprising a signal magnitude monitor measuring magnitude of voltage associated with the amplifier driving the speakers in accordance with the command signal, and wherein the first event is defined, at least in part, by the magnitude measured by the signal magnitude monitor.

3. The noise cancellation system of claim 2, wherein the signal director module passes the entirety of the command signal to the in-phase speaker controller, with none of the command signal being passed to the arrayed speaker controller, in real time response to the measured magnitude exceeding a threshold.

4. The noise cancellation system of claim 2, wherein the second event is defined, at least in part, by the magnitude measured by the signal magnitude monitor and wherein the signal director module passes the entirety of the command signal to the arrayed speaker controller, with none of the command signal being passed to the in-phase speaker controller, in real time response to the measured magnitude dropping below a threshold.

5. The noise cancellation system of claim 1, wherein the second event is time-based, and wherein the signal director module passes the entirety of the command signal to the arrayed speaker controller, with none of the command signal being passed to the in-phase speaker controller, in response to a passage of a predetermined period.

6. The noise cancellation system of claim 1, wherein a gain applied by the amplifier to the in-phase driver signal for all of the speakers is inversely proportional to a number of the speakers.

7. The noise cancellation system of claim 1, further comprising an adder combining each driver signal with the in-phase driver signal to produce a respective hybrid command signal for each speaker before that hybrid command signal passes to the amplifier.

8. The noise cancellation system of claim 7, wherein the hybrid command signals are derived from the command signal produced by the system controller.

9. A method of attenuating noise comprising:

producing a command signal in response to a signal from at least one microphone detecting sound in an area;

passing an entirety of the command signal to an arrayed speaker controller in response to a first event and passing the entirety of the command signal to an in-phase speaker controller in response to a second event;

producing, by the arrayed speaker controller, when the command signal is passed to the arrayed speaker controller, a respective driver signal for each of a plurality of speakers in response to the command signal such that combined sound emitted by the speakers in response to the driver signals produces a substantially uniform sound pressure field having a magnitude and phase adapted to attenuate a noise field corresponding to the sound detected by the at least one microphone; and producing, by the in-phase speaker controller, when the command signal is passed to the in-phase speaker controller, a common in-phase driver signal for all of the speakers in response to the command signal.

10. The method of claim 9, further comprising measuring the magnitude of voltage associated with driving the speakers in accordance with the command signal, and wherein the first event is defined, at least in part, by the measured magnitude.

11. The method of claim 10, further comprising passing the entirety of the command signal to the in-phase speaker controller, with none of the command signal being passed to the arrayed speaker controller, in real time response to the measured magnitude exceeding a threshold.

12. The method of claim 10, wherein the second event is defined, at least in part, by the measured magnitude, the method further comprising passing the entirety of the command signal to the arrayed speaker controller, with none of the command signal being passed to the in-phase speaker controller, in real time response to the measured magnitude dropping below a threshold.

13. The method of claim 9, further comprising applying a gain to the in-phase driver signal for all of the speakers that is inversely proportional to a number of the speakers.

14. The method of claim 9, further comprising combining each driver signal with the in-phase driver signal to produce a respective hybrid command signal for each speaker.

15. A vehicle comprising:

a passenger compartment;

a noise cancellation system comprising:

a plurality of speakers disposed within an area in the passenger compartment;

an amplifier in communication with the speakers; and a system controller, in communication with the amplifier, producing a command signal in response to a signal from at least one microphone detecting sound in the area, the system controller including:

an arrayed speaker controller configured to produce a driver signal for each of the speakers in response to the command signal such that combined sound emitted by the speakers in response to the driver signals produces a substantially uniform sound pressure field having a magnitude and phase adapted to attenuate a noise field corresponding to the sound detected by the at least one microphone, an in-phase speaker controller configured to produce a common in-phase driver signal for all of the speakers in response to the command signal; and a signal director module configured to pass an entirety of the command signal to the arrayed speaker controller in response to a first event and pass the entirety of the command signal to the in-phase speaker controller in response to a second event.

16. The vehicle of claim 15, further comprising a signal magnitude monitor measuring magnitude of voltage associated with the amplifier driving the speakers in accordance with the command signal, and wherein the first event is defined, at least in part, by the magnitude measured by the signal magnitude monitor.

17. The vehicle of claim 16, wherein the signal director module passes the entirety of the command signal to the in-phase speaker controller, with none of the command signal being passed to the arrayed speaker controller, in real time response to the measured magnitude exceeding a threshold.

18. The vehicle of claim 16, wherein the signal director module passes the entirety of the command signal to the arrayed speaker controller, with none of the command signal being passed to the in-phase speaker controller, in real time response to the measured magnitude dropping below a threshold.

19. The vehicle of claim 18, wherein a gain applied by the amplifier to the in-phase driver signal for all of the speakers is inversely proportional to a number of the speakers.

20. The vehicle of claim 18, further comprising an adder combining each driver signal with the in-phase driver signal to produce a respective hybrid command signal for each speaker before that hybrid command signal passes to the amplifier.

21. The vehicle of claim 20, wherein the hybrid command signals are derived from the command signal produced by the system controller.

* * * * *